United States Patent [19]

Langley

[11] Patent Number: 4,808,815

[45] Date of Patent: Feb. 28, 1989

[54] APPARATUS FOR TESTING LIGHT-EMITTING DEVICES USING PROBE MEANS HAVING A PRESELECTED PATTERN ARRANGEMENT

[75] Inventor: Frank J. Langley, Concord, Mass.

[73] Assignee: GenRad, Inc., Waltham, Mass.

[21] Appl. No.: 29,451

[22] Filed: Mar. 23, 1987

[51] Int. Cl.$^4$ .............................................. G02B 6/14
[52] U.S. Cl. ................................... 250/227; 350/96.1
[58] Field of Search .............. 250/227; 350/96.1, 96.2, 350/96.29

[56] References Cited

U.S. PATENT DOCUMENTS

| | | | |
|---|---|---|---|
| 3,215,843 | 6/1961 | Neil | 250/295 |
| 3,484,614 | 12/1969 | Tobey et al. | 250/227 |
| 3,511,999 | 11/1966 | Pelenc | 250/214 |
| 3,609,450 | 2/1969 | Hart | 315/82 |
| 3,681,654 | 8/1972 | Quinn | 315/151 |
| 3,963,920 | 6/1976 | Palmer | 250/227 |
| 3,996,494 | 12/1976 | Suga | 315/151 |
| 4,234,820 | 11/1980 | Widmayer | 315/152 |
| 4,275,294 | 6/1981 | Davidson | 250/227 |
| 4,427,881 | 1/1984 | Ruell | 250/227 |
| 4,529,875 | 7/1985 | Brogardh et al. | 250/227 |
| 4,544,843 | 10/1985 | Kern et al. | 250/239 |

Primary Examiner—David C. Nelms
Assistant Examiner—Stephone B. Allen
Attorney, Agent, or Firm—Nutter, McClennen & Fish

[57] ABSTRACT

A probe is disclosed which may be used to test the optical functions of a wide variety of light-emitting devices or displays. The probe comprises a fiber optic cable and a detector. When the probe is placed in close proximity to a light source, the detector produces an electrical output signal whose magnitude is indicative of the intensity of the light conducted by the fiber optic cable. The output signal is electrically compatible with conventional automatic test equipment inputs. As a result, a plurality of probes may be arranged in a test fixture which may be connected directly to an automatic test unit, thereby permitting the automatic testing of the optical functions of a device under test.

14 Claims, 6 Drawing Sheets

APPARATUS FOR TESTING LIGHT-EMITTING DEVICES USING PROBE MEANS HAVING A PRESELECTED PATTERN ARRANGEMENT

BACKGROUND OF THE INVENTION

1. Field of the Invention

The present invention relates to the optical testing of light-emitting devices and displays. More specifically, the invention relates to a test apparatus which may be used, in conjunction with conventional automatic test equipment, to optically test a variety of light-emitting devices.

2. Discussion of the Prior Art

As a result of the advent of automatic test equipment (ATE), the testing of the electrical functions of complex devices has become highly automated. For example, a printed circuit board which contains a variety of discrete components, integrated circuits and other devices may be subjected to comprehensive electrical testing by means of a "bed of nails" test fixture. Printed circuit boards, however, frequently include light-emitting components such as light-emitting diodes, seven-segment displays and the like, which must be tested both electrically and optically. Optical testing may determine whether a component is actually emitting light when it should be, whether the emission exceeds a minimum acceptable intensity, whether the intensities among several components are sufficiently uniform, etc.

One technique of optically testing light-emitting devices involves a machine vision system in which a television camera is aimed at a light-emitting device under test (DUT). The image produced by the camera provides information on emitter intensity and background intensity on a pixel-by-pixel basis. An analog-to-digital conversion is then performed and the equivalent binary values are stored in memory.

The disadvantages of this type of vision system are numerous. First, the output signals provided by the vision system are typically not electrically compatible with conventional ATE inputs, thus preventing a direct connection of the vision system with an ATE host. As a result, the optical testing of the DUT cannot be directly combined with the electrical testing into a common automatic test program.

Second, for certain types of optical testing, the vision system produces large amounts of data which are not useful. For example, assume that the object of the test is to determine simply whether a particular light-emitting device is illuminated at a particular time. Assume also that the DUT is a printed circuit board which contains several widely spaced light-emitting diodes and that the viewing angle of the camera is wide enough to cover the entire surface of the circuit board. Under these conditions, most of the pixels in the image produced by the camera will not be of the diodes themselves and are therefore not of interest. Moreover, most of the corresponding binary data is irrelevant and a data reduction process must be performed, which typically requires complex image processing software.

Third, the camera provides a fixed, uniform spatial resolution across its entire field of view. This may represent a significant disadvantage in cases where the DUT contains several widely spaced clusters of closely spaced light-emitting devices. In order to resolve two adjacent light-emitting devices while also monitoring the entire DUT, the vision system may require additional cameras, thereby increasing the cost and complexity of the system.

Finally, the cost of the vision system is relatively high due to the necessity of the camera(s), the large memory required to store the data and the image processing software.

SUMMARY OF THE INVENTION

The present invention provides a test fixture which may be used in conjunction with conventional automatic test equipment to perform optical testing of a wide variety of light-emitting devices. The fixture comprises a plurality of individual optical probes arranged in a preselected pattern, whereby each of the probes corresponds to a particular light-emitting component of the DUT. Each probe is disposed in close proximity to a light-emitting component and a fiber optic cable connects each probe to a detector. Each of the detectors provides an electrical output signal which is related to the intensity of the light conducted by its fiber optic cable. The output signals of the detectors are electrically compatible with conventional ATE inputs and may be directly connected thereto. Each detector may be individually calibrated.

Each probe may be mounted in a fixed position or, alternatively, may be provided with a telescopic capability, whereby a DUT having light-emitting components of varying heights may be accommodated. In addition, the light-conducting fiber within each fiber optic cable may be recessed with respect to its casing, thereby effectively decreasing its acceptance angle. As a result, the spatial resolution of the test fixture may be adjusted on a probe-by-probe basis.

The present invention provides additional advantages over a conventional vision system. For example, since each light-emitting component under test is paired with an individual probe, the need for a camera is eliminated. Moreover, because each probe is directed to a specific light-emitting component, as opposed to an area which may contain numerous components, the present invention produces data with respect to the light-emitting components only. Thus, by eliminating large quantities of irrelevant data, the present invention also eliminates the need for a large memory to store such data and the complex software required to process the data.

Both the test fixture and probe are low in cost and simple to construct. The test fixture is durable and is easy to operate.

BRIEF DESCRIPTION OF THE DRAWINGS

This invention is pointed out with particularity in the appended claims. The above and further advantages of this invention may be better understood by referring to the following description taken in conjunction with the accompanying drawings, in which:

DETAILED DESCRIPTION OF AN ILLUSTRATIVE EMBODIMENT

Figure 1:
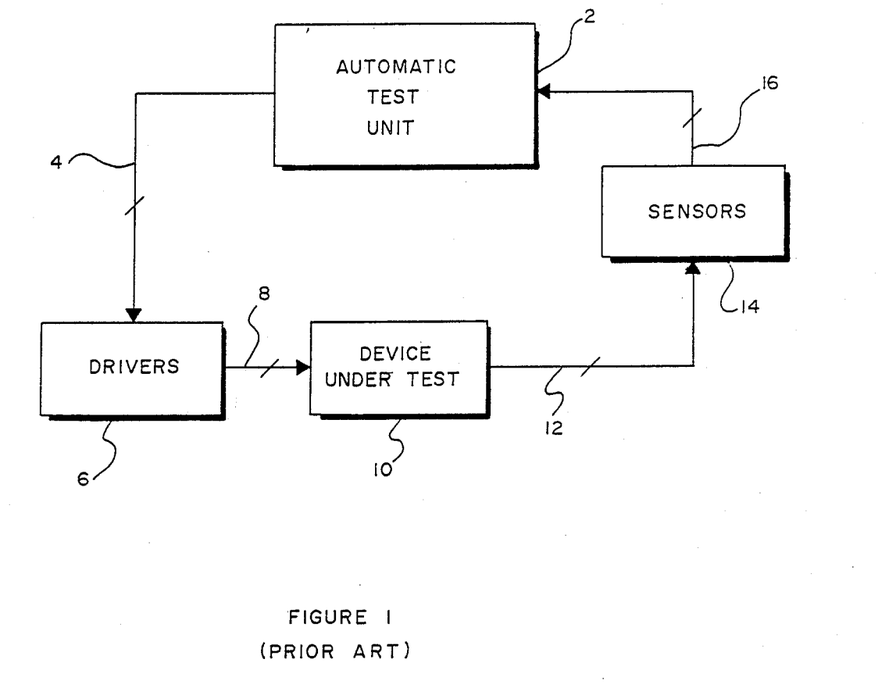
FIG. 1 is a functional block diagram of a system known in the prior art for automatically testing the electrical functions of a device under test.

FIG. 1 is a block diagram of a system known in the prior art for automatically testing the electrical functions of a given device. An automatic test unit 2 provides a plurality of output lines 4 which are connected to a plurality of drivers 6. The drivers 6 are in turn connected by a plurality of probes 8 to a device under test (DUT) 10. A plurality of probes 12 connects the DUT 10 to a plurality of electrical sensors 14. The sensors 14 provide a plurality of output lines 16 which are connected to the test unit 2.

In general, the test unit 2 may be programmed to automatically perform a series of electrical tests on the DUT 10. The sensors 14 monitor the areas of interest on the DUT and provide data to the test unit 2. The sensors 14, however, are generally responsive only to electrical signals and are not capable of sensing optical signals which may be produced by light-emitting components of the DUT 10.

Figure 2:
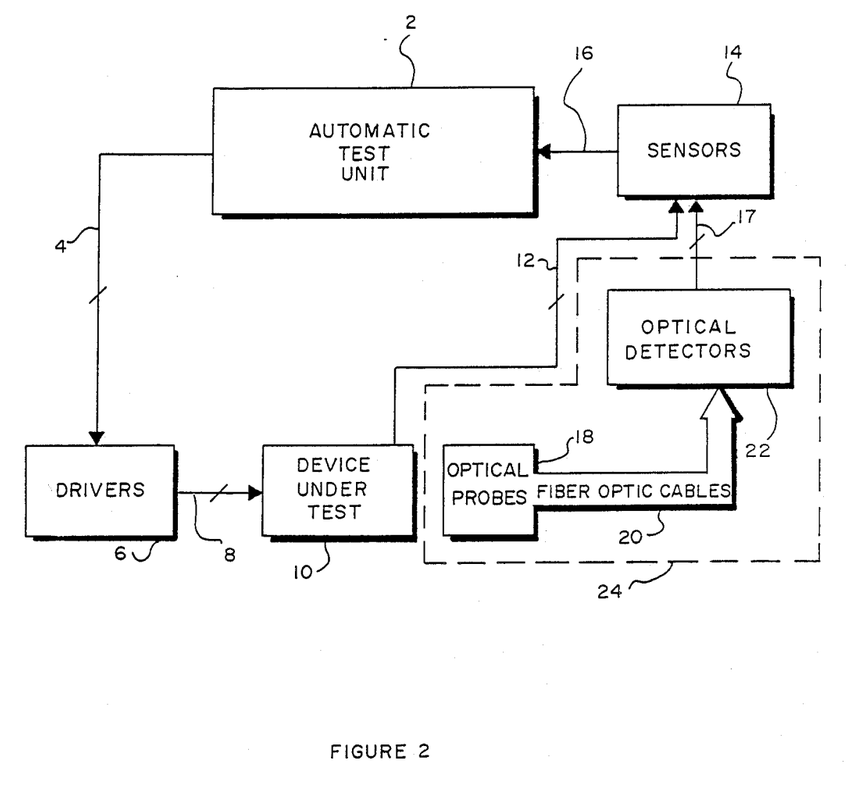
FIG. 2 is a functional block diagram of a system for automatically testing the optical functions of one or more light-emitting devices.

FIG. 2 is a block diagram of a system for optically testing one or more light-emitting devices. For consistency, components which are similar to those shown in FIG. 1 retain the same reference numerals. An optical test fixture 24 comprises one or more optical probes 18, each of which is connected to an optical detector 22 by a fiber optic cable 20. The probes 18 are disposed in close proximity to the DUT 10, whereby light emitted by components thereon may be conducted along the fiber optic cables 20 to the detectors 22. Output lines 17 of the detectors 22 are connected to the sensors 14. As a result, the optical functions of the DUT 10 may be automatically tested by the test unit 2 in a manner similar to that discussed above.

Figure 3:
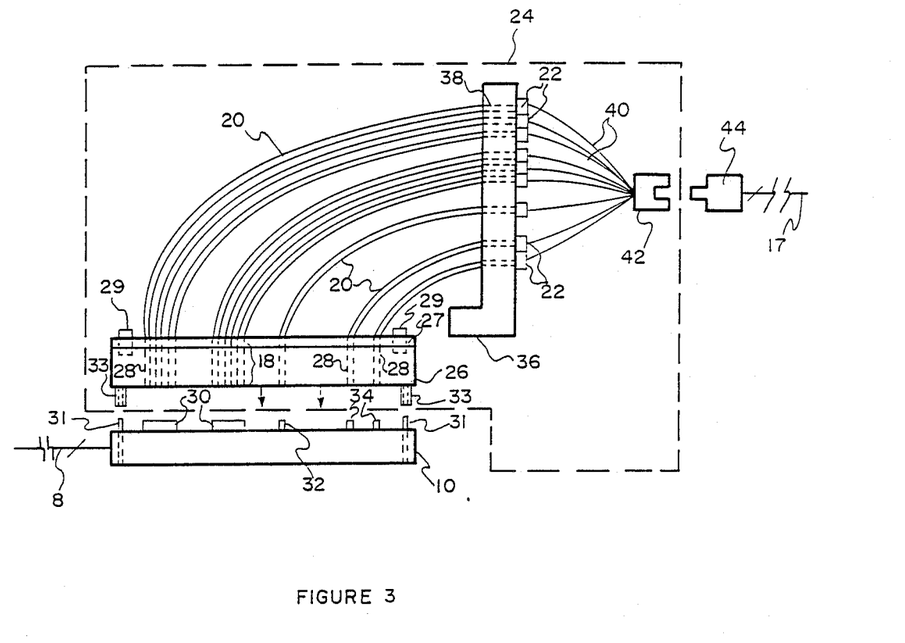
FIG. 3 is an elevational view of an optical test apparatus constructed in accordance with the preferred embodiment of the present invention.

FIG. 3 is an elevational view of the test fixture 24 shown in FIG. 2. A pinch plate 27 is disposed upon a retaining plate 26. Two fasteners 29 extend through the pinch plate 27 to the retaining plate 26. Two pins 31 extend upward from the DUT 10. Two bushings 33 extend downward from the bottom of the retaining plate 26.

A plurality of bores 28 extend through both of the plates 26 and 27. The bores 28 are arranged in a preselected pattern which corresponds with the arrangement of several light-emitting components 30, 32 and 34. An optical probe 18 is disposed in each of the bores 28. Each probe 18 comprises a fiber optic cable 20. Each cable 20 extends upward from the pinch plate 27 into a bore 38, which is disposed in a support member 36. A detector 22 is disposed adjacent to each of the bores 38 and is coupled to the end of the cable 20 disposed therein. A lead 40 extends from each of the detectors 22 to a multi-pin connector 42. The connector 42 thus provides an interface to the test fixture 24. A connector 44, which is shaped to mate with the connector 42, serves to connect the test fixture 24 to the sensors 14 via lines 17 (FIG. 2).

Each of the fasteners 29 may comprise, for example, a screw disposed in a slot, whereby when the screw is loosened, the pinch plate 27 may slide laterally with respect to the retaining plate 26. By imparting a slight lateral displacement of the pinch plate 27 with respect to the retaining plate 26 and then tightening the fasteners 29, a lateral force is imposed upon the probes 18. This lateral force tends to retain the probes 18 in their correct respective positions.

The operation of the test fixture 24 may be summarized as follows. First, the retaining plate 26 is placed in close proximity to the DUT 10. The pins 31 engage the bushings 33, thereby ensuring correct alignment or registration of the retaining plate 26 with the DUT 10. As a result, the probes 18 are placed in close proximity to the light-emitting components 30, 32 and 34, thereby permitting the probes to receive light emitted by the components. The test unit 2, in accordance with its programming, controls the drivers 6, which in turn cause the DUT 10 to run through a series of preselected conditions or states. During certain ones of the preselected states, one or more of the light-emitting components 30, 32 or 34 may be illuminated. The probe 18 which corresponds to the illuminated component will conduct a portion of the emitted light along its fiber optic cable 20 to the corresponding detector 22.

The detector 22 produces an electrical output signal whose magnitude is indicative of the intensity of the light received. The output signal is conducted along the lead 40 and one of the lines 17 to the corresponding sensor 14. By comparing the output signals received from the various sensors 14 to a preselected reference, the test unit 2 may determine whether a particular light-emitting component is actually illuminated when it should be, whether the component is providing a minimum brightness, whether two or more components are of uniform brightness, etc.

Figure 4A:
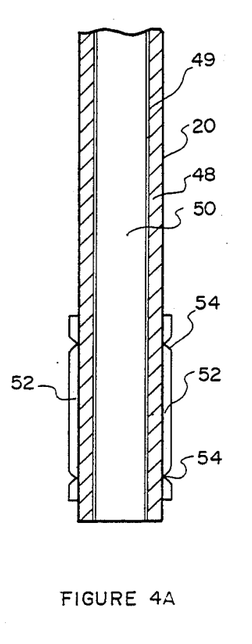
FIGS. 4A, 4B, 4C, 4D and 4E are a series of cross-sectional views showing the assembly of a telescopic probe.
Figure 4B:
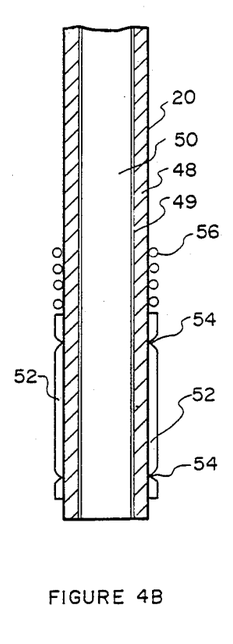
Figure 4C:
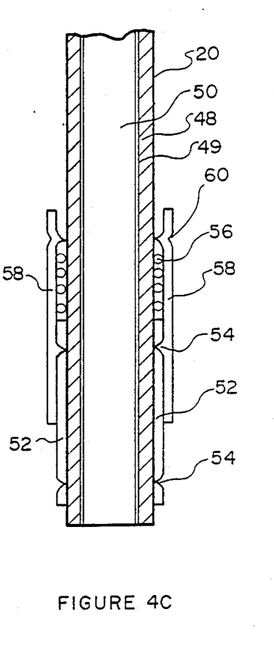

As an alternative to mounting the probes 18 in fixed positions, one or more of the probes may comprise a telescopic feature, as depicted in FIGS. 4A–4E. The fiber optic cable 20 comprises a light-conducting inner core 50, which is surrounded by an outer cladding 49 and a jacket 48. One end of the fiber optic cable 20 is inserted through a cylindrical sleeve 52. The sleeve 52 may be secured to the jacket 48, for example, by two crimps 54. The portion of the fiber optic cable 20 which extends below the sleeve 52 may be subsequently trimmed to a desired length. As shown in FIGS. 4B and 4C, the free end of the fiber optic cable 20 is inserted through a spring 56, whereby the spring is disposed above and adjacent to the sleeve 52. Subsequently, the cable 20 (along with the sleeve 52 and spring 56) is inserted through a second sleeve 58. A crimp 60, disposed in the upper portion of the sleeve 58, serves to prevent upward movement of the spring 56.

Figure 4D:
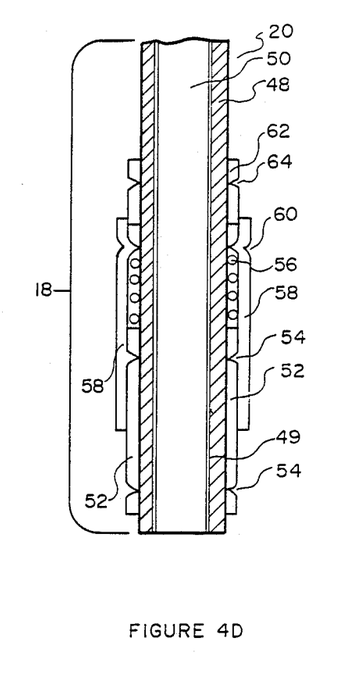

As shown in FIG. 4D, a retaining ring 62 is slid onto the free end of the fiber optic cable 20 and disposed adjacent to the sleeve 58. The retaining ring 62 is secured to the jacket 48 by a crimp 64, thereby restricting the downward movement of the sleeve 52 and the cable 20.

Figure 4E:
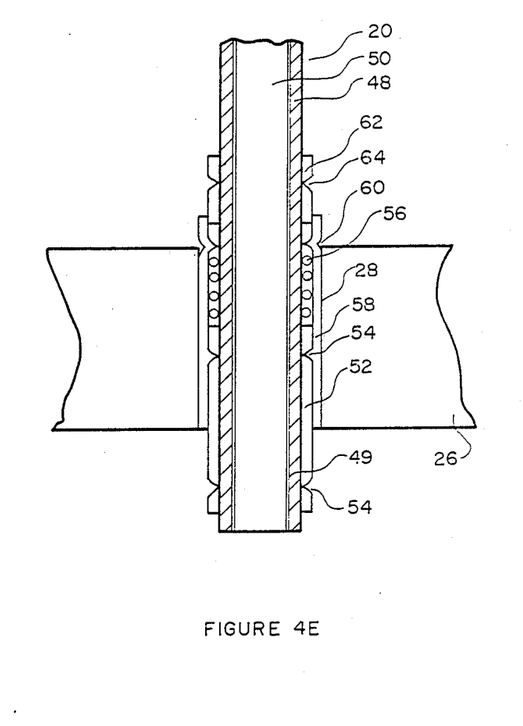

When an upward force is applied to the bottom of the probe 18, the cable 20 and sleeve 52 move upward, thereby retracting the probe and compressing the spring 56. When the force is removed, the spring 56 tends to restore the probe 18 to its extended position. Thus, as shown in FIG. 4E, once the assembled probe 18 is disposed in the retaining plate 26, each individual probe 18 may be extended or retracted to accommodate a device under test which contains light-emitting components of varying height.

The light-conducting inner core 50, along with the outer cladding 49, may be selectively recessed within the jacket 48. The effect of recessing the inner core 50 is that the acceptance angle of the probe 18 is decreased.

In other words, when the inner core 50 is recessed, it "sees" or accepts light from a narrower field-of-view than it otherwise would. As a result, the spatial resolution of the test fixture 24 may be advantageously altered on a probe-by-probe basis. For example, if several light-emitting components are located very close to each other, the acceptance angles of the corresponding probes may be adjusted to prevent one probe from receiving light emitted by an adjacent component.

Figure 5:
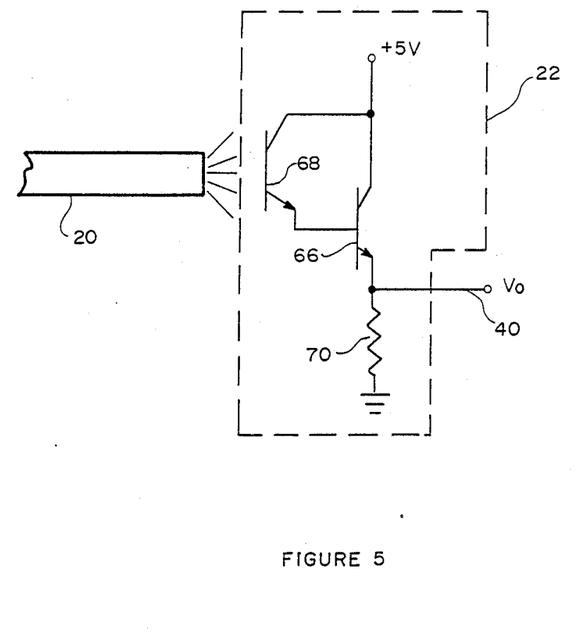
FIG. 5 is a circuit diagram of the detector shown in FIG. 3.

FIG. 5 is a schematic diagram of the detector 22 shown in FIG. 3. Two transistors 66 and 68 are arranged in a Darlington pair configuration. Transistor 68 is a photo-sensitive transistor. A load resistance 70 is connected between the emitter of the transistor 66 and ground potential. The end of the fiber optic cable 20 is disposed in close proximity to the collector-base junction of the transistor 68. The lead 40 may be connected directly to an electrical sensor 14, as shown in FIGS. 2 and 3.

When light conducted by the fiber optic cable 20 shines on the transistor 68, an output signal $V_o$ is produced. The magnitude of the output signal $V_o$ is indicative of the magnitude of the light intensity received by the transistor 68.

The combination of transistors 66 and 68 is available as a discrete component such as Motorola part MFOD-73, which includes a connector for attaching the fiber optic cable 20. The load resistance 70 may comprise, for example, a discrete resistor or a rheostat. If a rheostat is used, each detector 22 may be individually calibrated by simply placing the probe 18 in close proximity to a calibrated light source, and then adjusting the rheostat to set the output signal $V_o$ at a predetermined level.

The foregoing description has been limited to a specific embodiment of this invention. It will be apparent, however, that variations and modifications may be made to the invention, with the attainment of some or all of the advantages of the invention. Therefore, it is the object of the appended claims to cover all such variations and modifications as come within the true spirit and scope of the invention.

What is claimed as new and desired to be secured by Letters Patent of the United States is:

1. An apparatus for optically testing one or more light-emitting devices, said devices being arranged in a fixed pattern, said apparatus comprising:
   A. retaining means, said retaining means for securing one or more probe means, said probe means being arranged in a preselected pattern which corresponds with said fixed pattern such that each said probe means may optically test a predetermined light-emitting device;
      1. each of said probe means including a light-conducting fiber and a detector, said fiber having first and second ends, said first end of said fiber for receiving light emitted by said predetermined light-emitting device, said second end of said fiber being coupled to a detector means, each of said probe means having an adjustable spatial resolution,
      2. said detector means for producing an output signal in response to light conducted by said fiber, said output signal having a magnitude that is related to the intensity of said light.

2. The apparatus as in claim 1 wherein said light-conducting fiber is disposed within a casing, said fiber being recessed within said casing by a preselected distance, whereby an angle of acceptance of said fiber is effectively decreased.

3. The apparatus as claim 1 wherein said detector includes means for calibrating said output signal.

4. The apparatus as in claim 1 wherein said retaining means includes one or more telescopic probe means.

5. The apparatus as in claim 6 wherein said retaining means comprises a first plate means, said first plate means having a plurality of apertures disposed therein, said apertures being arranged to correspond with said preselected pattern, each of said apertures being adapted to receive one or more of said probe means.

6. The apparatus as in claim 5 wherein said retaining mean further comprises a second plate means, said second plate means being disposed adjacent to said first plate means, said second plate means having a plurality of apertures disposed therein which correspond to the aperture disposed in the first plate means, said second plate means including one or more fastening means, said fastening means for securing said second plate to said first plate, whereby each of said probe means is retained in a substantially fixed position.

7. An apparatus for optically testing one or more light-emitting devices, said devices being arranged in a fixed pattern, said apparatus being adapted to interface with an automatic test unit, whereby said light-emitting devices may be automatically tested, said apparatus comprising:
   A. retaining means, said retaining means for securing one or more probe means, said probe means being arranged in a preselected pattern which corresponds with said fixed pattern such that each said probe means may optically test a predetermined light-emitting device;
      1. each of said probe means including a light-conducting fiber and a detector, said fiber having first and second ends, said first end of said fiber for receiving light emitted by said predetermined light emitting device, said second end of said fiber being coupled to a detector means, each of said probe means having an adjustable spatial resolution,
      2. said detector means for producing an output signal in response to light conducted by said fiber, said output signal having a magnitude that is related to the intensity of said light, said output signal being compatible with said automatic test equipment.

8. The apparatus as in claim 7 wherein said light-conducting fiber is disposed within a casing, said fiber being recessed within said casing by a preselected distance, whereby the angle of acceptance of said fiber is effectively decreased.

9. The apparatus as claim 7 wherein said detector includes means for calibrating said output signal.

10. The apparatus as in claim 7 wherein said retaining means includes one or more telescopic probe means.

11. The apparatus as in claim 7 wherein said automatic test equipment is programmed to automatically test the optical functions of said light-emitting devices.

12. The apparatus as in claim 7 wherein said light-emitting devices are parts of a device under test, said device under test including one or more electrical components in addition to said light-emitting devices, and said automatic test equipment is programmed to automatically test the optical functions and electrical functions of said device under test.

13. The apparatus as in claim 7 wherein said retaining means comprises a plate means, said first plate means having a plurality of apertures disposed therein, said apertures being arranged to correspond with said preselected pattern, each of said apertures being adapted to receive one or more of said probe means.

14. The apparatus as in claim 13 wherein said retaining means further comprises a second plate means, said second plate means being disposed adjacent to said first plate means, said second plate means having a plurality of apertures disposed therein which correspond to the apertures disposed in the first plate means, said second plate means including one or more fastening means, said fastening means for securing said second plate to said first plate, whereby each of said probe means is retained in a substantially fixed position.

* * * * *